(12) United States Patent
Chung et al.

(10) Patent No.: US 9,859,305 B2
(45) Date of Patent: Jan. 2, 2018

(54) LIQUID CRYSTAL DISPLAY DEVICE AND METHOD OF MANUFACTURING THE SAME

(71) Applicant: Samsung Display Co., Ltd., Yongin-si, Gyeonggi-Do (KR)

(72) Inventors: Yung Bin Chung, Seoul (KR); Bo Geon Jeon, Gimcheon-si (KR); Eun Jeong Cho, Busan (KR); Tae Young Ahn, Suwon-si (KR); Woo Seok Jeon, Seoul (KR); Sung Hoon Yang, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/130,654

(22) Filed: Apr. 15, 2016

(65) Prior Publication Data

US 2017/0110481 A1     Apr. 20, 2017

(30) Foreign Application Priority Data

Oct. 14, 2015   (KR) ........................ 10-2015-0143545
Oct. 16, 2015   (KR) ........................ 10-2015-0144423

(51) Int. Cl.
*H01L 21/306*   (2006.01)
*H01L 27/12*    (2006.01)
(Continued)

(52) U.S. Cl.
CPC ........ *H01L 27/1222* (2013.01); *G02F 1/1368* (2013.01); *G02F 1/136286* (2013.01); *H01L 21/30604* (2013.01); *H01L 21/32133* (2013.01); *H01L 21/465* (2013.01); *H01L 21/47635* (2013.01); *H01L 27/1262* (2013.01); *H01L 29/42356* (2013.01); *H01L 29/45* (2013.01);
(Continued)

(58) Field of Classification Search
CPC ............. H01L 27/1222; H01L 27/1262; H01L 21/30604; H01L 21/32133
See application file for complete search history.

(56) References Cited

U.S. PATENT DOCUMENTS 5,017,983 A     5/1991   Wu
5,366,912 A *  11/1994   Kobayashi ........ H01L 29/66765
                                                    257/53

(Continued)

FOREIGN PATENT DOCUMENTS

KR    10-0416853 B1    10/2003
KR    10-1238233 B1     1/2008
KR    10-0937173 B1     7/2008

*Primary Examiner* — Dung Le
(74) *Attorney, Agent, or Firm* — H.C. Park & Associates, PLC

(57) ABSTRACT

Provided are liquid crystal display and the method for manufacturing the same. According to an aspect of the present invention, there is provided a liquid crystal display device, including a first substrate; a gate electrode disposed on the first substrate; a semiconductor pattern layer disposed on the gate electrode; and a source electrode and a drain electrode disposed on the semiconductor pattern layer and facing each other, wherein a diffusion prevention pattern is disposed on the semiconductor pattern layer to prevent diffusion into the semiconductor pattern layer or to maintain uniform thickness of the semiconductor pattern layer.

21 Claims, 15 Drawing Sheets

(51) Int. Cl.
*G02F 1/1368* (2006.01)
*G02F 1/1362* (2006.01)
*H01L 29/786* (2006.01)
*H01L 29/45* (2006.01)
*H01L 29/423* (2006.01)
*H01L 21/3213* (2006.01)
*H01L 21/465* (2006.01)
*H01L 21/4763* (2006.01)

(52) U.S. Cl.
CPC ............ H01L 29/78606 (2013.01); *G02F 2001/136295* (2013.01)

(56) References Cited

U.S. PATENT DOCUMENTS

| | | | |
|---|---|---|---|
| 6,214,702 B1 | 4/2001 | Kim | |
| 6,258,723 B1 | 7/2001 | Takeichi et al. | |
| 2011/0068340 A1* | 3/2011 | Lee | H01L 27/124 257/59 |
| 2012/0037913 A1* | 2/2012 | Seo | H01L 29/458 257/60 |

* cited by examiner

LIQUID CRYSTAL DISPLAY DEVICE AND METHOD OF MANUFACTURING THE SAME

CLAIM OF PRIORITY

This application claims the priority of and all the benefits accruing under 35 U.S.C. §119 from Korean Patent Application No. 10-2015-0143545 filed on Oct. 14, 2015 and No. 10-2015-0144423 filed on Oct. 16, 2015 in the Korean Intellectual Property Office (KIPO), the disclosure of which is incorporated herein by reference in its entirety.

BACKGROUND OF THE INVENTION

1. Field of Disclosure

The present invention relates to a liquid crystal display device and a method of manufacturing the same.

2. Description of the Related Art

The importance of a display device has increased with the development of multimedia. Accordingly, various types of liquid crystal devices, such as a liquid crystal display (LCD) device, an organic light emitting display (OLED) device, and the like, have been used.

Among these, a liquid crystal display device, which is one of the most widely used flat panel display devices, includes two substrates provided with field generating electrodes, such as a pixel electrode and a common electrode, and a liquid crystal layer disposed between the two substrates. The liquid crystal display device is configured such that a voltage is applied to the field generating electrodes to generate an electric field in the liquid crystal layer, and thus the direction of liquid crystal molecules in the liquid crystal layer is determined and the polarization of incident light, thereby displaying an image.

Generally, a liquid crystal display device is subjected to the steps of forming a plurality of films; and patterning the plurality of films using a mask. However, such a masking process requires a plurality of steps, and it takes time and cost for each of the steps. That is, the time and cost required for the process may be varied depending on the process design system, and, additionally, the performance required for driving the liquid crystal display device may also be varied.

SUMMARY OF THE INVENTION

Aspects of the present invention provide a liquid crystal display device, which includes a semiconductor pattern layer having excellent electrical characteristics.

Aspects of the present invention also provide a method of manufacturing a liquid crystal display device, by which the production efficiency of a liquid crystal display device is improved by omitting some processes.

According to an aspect of the present invention, there is provided a liquid crystal display device, including a first substrate; a gate electrode disposed on the first substrate; a semiconductor pattern layer disposed on the gate electrode; a diffusion prevention pattern disposed on the semiconductor pattern layer; an ohmic contact layer disposed on the semiconductor pattern layer and exposing a part of the diffusion prevention pattern; and a source electrode and a drain electrode disposed on the ohmic contact layer to overlap the ohmic contact layer and facing each other to be spaced apart from each other.

The ohmic contact layer may contain a phosphorus (P) atom.

The concentration of the phosphorus (P) atom may be $1.74E+21/cm3$ or more.

A channel unit may be disposed in the space between the source electrode and the drain electrode spaced apart from each other, and the diffusion prevention pattern may overlap the channel unit.

The height of the semiconductor pattern layer overlapping the channel unit may be equal to the height of the semiconductor pattern layer not overlapping the channel unit.

The outer end of the diffusion prevention pattern may be relatively inwardly disposed compared to the outer end of the semiconductor pattern layer.

The diffusion prevention pattern may expose the upper surface of the semiconductor pattern layer overlapping the gate electrode.

The height of the center of the diffusion prevention pattern may be different from the height of both of the ends of the diffusion prevention pattern.

The inner wall of the diffusion prevention pattern, the source electrode, the drain electrode, and the inner wall of the ohmic contact layer may be aligned to each other.

The liquid crystal display device may further include a passivation film disposed on the source electrode and the drain electrode, wherein the diffusion prevention pattern may be made of a first inorganic insulating material, and the passivation film may be made of a second inorganic insulating material different from the first insulating material.

According to another aspect of the present invention, there is provided a method of manufacturing a liquid crystal display device, including providing a first substrate including a gate electrode and a gate insulating film disposed on the gate electrode; forming a semiconductor layer on the gate insulating film and forming a diffusion prevention layer on the semiconductor layer; patterning the diffusion prevention layer to form a diffusion prevention pattern and patterning the semiconductor layer to form a semiconductor pattern layer; forming an ohmic contact layer and a first conductive film on the diffusion prevention pattern and the semiconductor pattern layer; and batch-etching the first conductive film and the ohmic contact layer to form a channel unit.

The batch-etching the first conductive film and the ohmic contact layer to form the channel unit may include batch-etching the first conductive film and the ohmic contact layer to expose the upper surface of the diffusion prevention pattern.

The batch-etching the first conductive film and the ohmic contact layer to form the channel unit may include etching the diffusion prevention pattern to expose the upper surface of the semiconductor pattern layer.

The batch-etching the first conductive film and the ohmic contact layer to form the channel unit may include etching a part of the center of the diffusion prevention pattern such that the height of the center of the diffusion prevention pattern is different from the height of both sides of the diffusion prevention pattern.

The batch-etching the first conductive film and the ohmic contact layer to form the channel unit may include completely removing the diffusion prevention pattern.

The ohmic contact layer may contain a phosphorus (P) atom.

The concentration of the phosphorus (P) atom may be $1.74E+21/cm3$ or more.

However, aspects of the present invention are not restricted to the one set forth herein. The above and other aspects of the present invention will become more apparent to one of ordinary skill in the art to which the present invention pertains by referencing the detailed description of the present invention given below.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
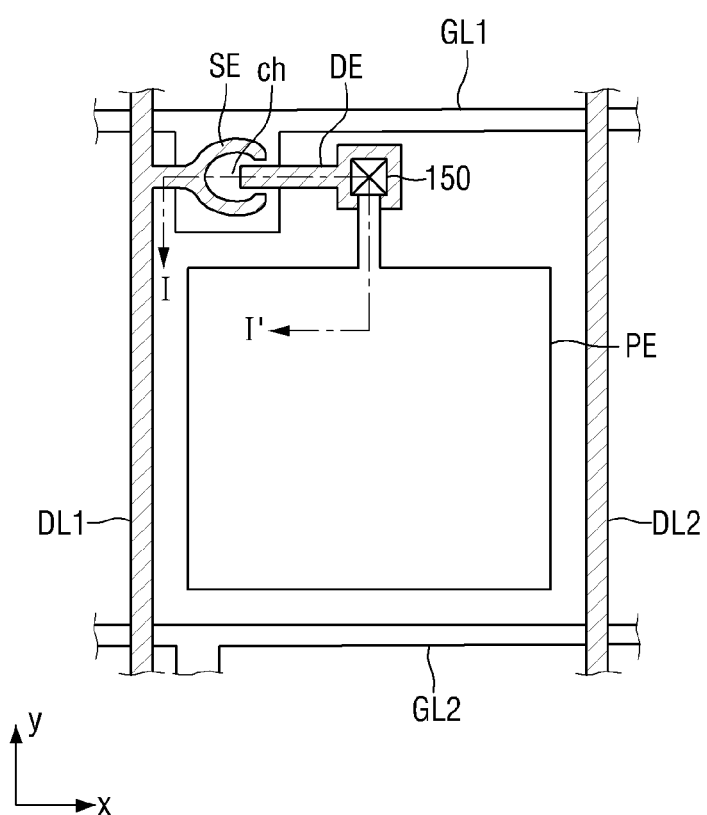
FIG. 1 is a plan view of a liquid crystal display device according to an embodiment of the present invention.

The aspects and features of the present invention and methods for achieving the aspects and features will be apparent by referring to the embodiments to be described in detail with reference to the accompanying drawings. However, the present invention is not limited to the embodiments disclosed hereinafter, but can be implemented in diverse forms. The matters defined in the description, such as the detailed construction and elements, are nothing but specific details provided to assist those of ordinary skill in the art in a comprehensive understanding of the invention, and the present invention is only defined within the scope of the appended claims.

The term "on" that is used to designate that an element is on another element or located on a different layer or a layer includes both a case where an element is located directly on another element or a layer and a case where an element is located on another element via another layer or still another element. In the entire description of the present invention, the same drawing reference numerals are used for the same elements across various figures.

Although the terms "first, second, and so forth" are used to describe diverse constituent elements, such constituent elements are not limited by the terms. The terms are used only to discriminate a constituent element from other constituent elements. Accordingly, in the following description, a first constituent element may be a second constituent element.

Hereinafter, preferred embodiments of the present invention will be described in detail with reference to the attached drawings.

Hereinafter, preferred embodiments of the present invention will be described in detail with reference to the attached drawings.

Figure 2:
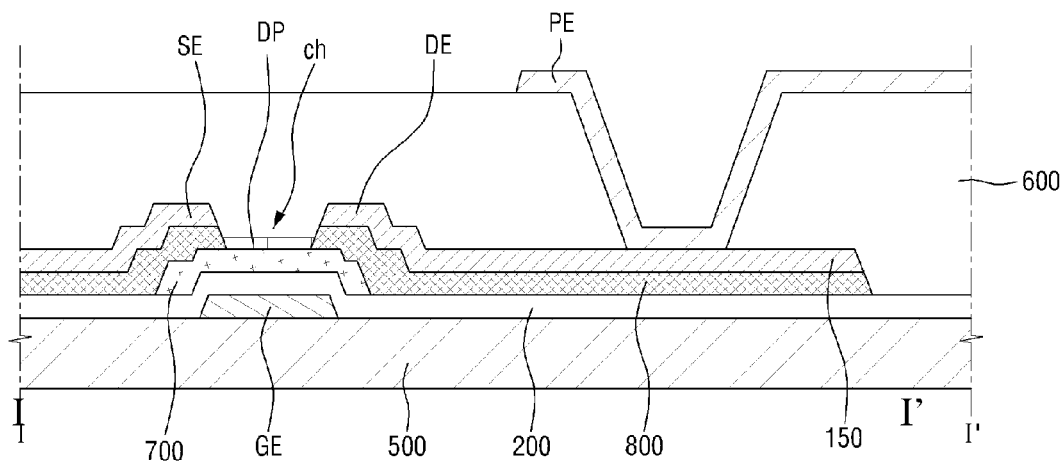
FIG. 2 is a cross-sectional view taken along the line I-I' of FIG. 1.
Figure 3:
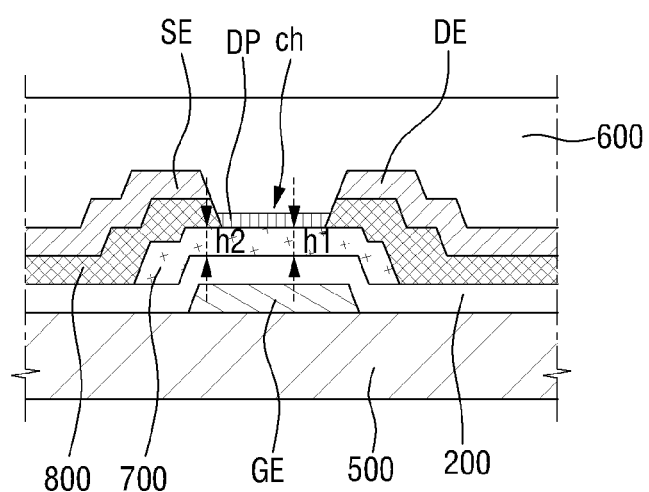
FIG. 3 is a cross-sectional view showing a part of the configuration of FIG. 2.
Figure 4:
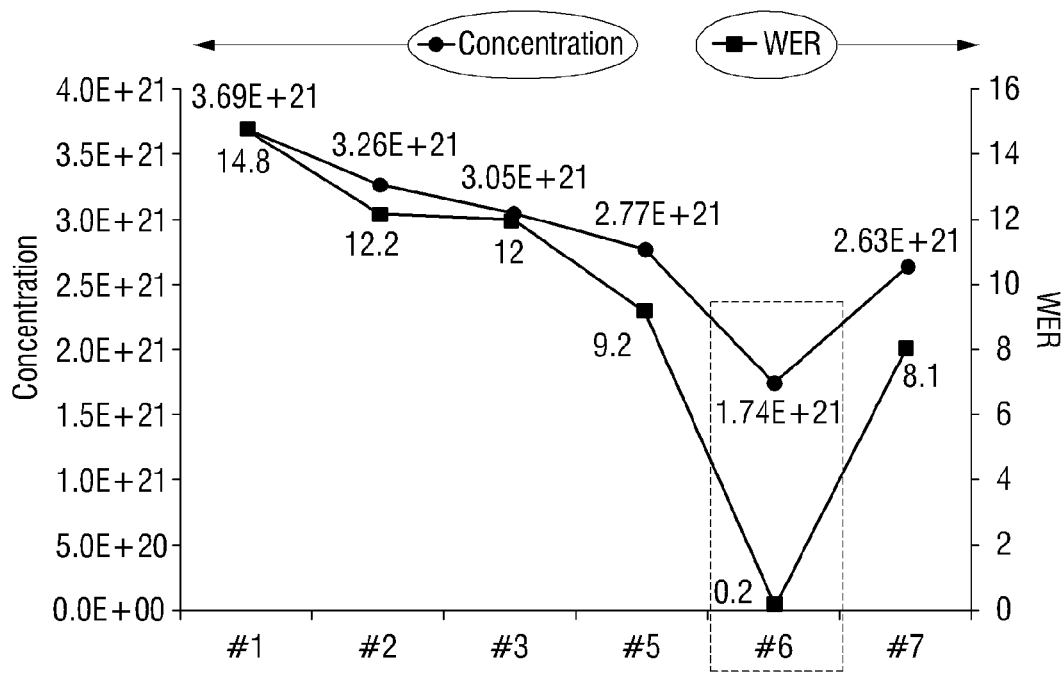
FIG. 4 is a graph showing the characteristics of a part of the configuration of the liquid crystal display device according to an embodiment of the present invention.

FIG. 1 is a plan view of a liquid crystal display according to an embodiment of the present invention. FIG. 2 is a cross-sectional view taken along line I-I' of FIG. 1. FIG. 3 is a cross-sectional view showing a part of the configuration of FIG. 2. FIG. 4 is a graph showing the characteristics of a part of the configuration of the liquid crystal display device according to an embodiment of the present invention.

Referring to FIGS. 1 and 2, the liquid crystal display according to the embodiment of the present invention includes a first substrate 500, a gate electrode GE disposed on the first substrate 500 and a gate insulating film 200 may be disposed to cover the gate electrode GE, and may be formed to overlie the entire major surface of the first substrate 500, a semiconductor pattern layer 700 disposed on the gate electrode GE, a diffusion prevention layer DP disposed on the semiconductor pattern layer 700, an ohmic contact layer 800 disposed on the semiconductor pattern layer 700 to expose a part of the diffusion prevention layer DP therethrough, and a source electrode SE and a drain electrode DE disposed on the ohmic contact layer 800 to overlap the ohmic contact layer 800, spaced apart from each other and facing each other.

The first substrate 500 may be made of a material having heat resistance and transmissivity. For example, the first substrate 500 may be made of transparent glass or plastic, but the material for the first substrate 500 is not limited thereto.

Gate wires GL and GE may be disposed on the first substrate 500. The gate wires GL and GE may include a gate line GL to which a signal required in driving is transferred, a gate electrode GE protruding from the gate line GL to have a protrusion shape, and gate terminal ends (not shown) disposed at at least one end of the gate lines GL1 and GL2.

The gate line GL may extend in a first direction. The gate electrode GE may constitute three terminals of a thin film transistor together with the source electrode SE and the drain electrode DE as will be described later.

A plurality of gate lines GL may be provided, and the gate lines GL extend in parallel.

FIG. 1 shows the gate line GL including a first gate line GL1 and a second gate line GL2.

The gate wires GL and GE may include one or more of aluminum (Al)-based metal including an aluminum alloy, silver (Ag)-based metal including a silver alloy, copper (Cu)-based metal including a copper alloy, molybdenum (Mo)-based metal including a molybdenum alloy, chromium (Cr), titanium (Ti), and tantalum (Ta). However, the aforementioned examples are illustrative, the material of the gate wires GL and GE is not limited thereto, and metal or a polymer material having performance required to attain a desired display device may be used as the material of the gate wires GL and GE.

The gate wires GL and GE may have a single film structure but are not limited thereto, and may be a double-layered film, a triple-layered film, or a multi-layered film of three or more layers.

The gate insulating film 200 may be disposed on the gate wires GL and GE. The gate insulating film 200 may cover the gate wires GL and GE and be formed on an entire surface of the first substrate 500.

One or more materials selected from the group consisting of silicon oxide SiOx, an inorganic insulating material such as silicon nitride SiNx, and an organic insulating material such as BCB (benzocyclobutene), an acryl-based material, and polyimide may be mixed to form the gate insulating film 200. However, the aforementioned materials are illustrative, and the material of the gate insulating film 200 is not limited thereto.

The semiconductor pattern layer 700 may be disposed on the gate insulating film 200.

The semiconductor pattern layer 700 may include amorphous silicon or polycrystalline silicon. However, the semiconductor pattern layer 700 is not limited thereto, and may include an oxide semiconductor.

The semiconductor pattern layer 700 may have various shapes such as an island shape and a line shape. When the semiconductor pattern layer 700 has the line shape, the semiconductor pattern layer 700 may be positioned beneath a data line DL to extend to an upper portion of the gate electrode GE.

In the illustrative embodiment, the semiconductor pattern layer 700 may be patterned to have substantially the same shape as data wires DL, SE, DE, and 150 (not shown) as will be described later in a region other than a channel unit ch. In other words, the semiconductor pattern layer 700 may be disposed to overlap the data wires DL, SE, DE, and 150 (not shown) in the entire region other than the channel unit ch. However, the semiconductor pattern layer 700 is not limited thereto and disposed to overlap the gate electrode GE as shown in FIG. 2, and both ends of the semiconductor pattern layer 700 may be covered by the ohmic contact layer 800 as will be described later.

The channel unit ch may be disposed between the source electrode SE and the drain electrode DE facing each other. The channel unit ch acts to electrically connect the source electrode SE and the drain electrode DE, and a specific shape is not limited.

The diffusion prevention pattern DP may be disposed on the semiconductor pattern layer 700. The diffusion prevention pattern DP may be disposed at the center of the semiconductor pattern layer 700. In other words, both ends of the diffusion prevention pattern DP may be disposed in the relatively inner side as compared to both ends of the semiconductor pattern layer 700. Further, the diffusion prevention pattern DP may be disposed to overlap at least a part of the channel unit ch.

The diffusion prevention pattern DP may act to prevent a phosphorus (P) atom included in the ohmic contact layer 800 from being diffused into the semiconductor pattern layer 700. That is, the diffusion prevention pattern DP may have affinity with the phosphorus (P) atom that is relatively higher than that of the semiconductor pattern layer 700, thus preventing the phosphorus (P) atom included in the ohmic contact layer 800 from diffusing into the semiconductor pattern layer 700.

The diffusion prevention pattern DP may include an inorganic insulating material. For example, the diffusion prevention pattern DP may be formed to include one or more selected from the group consisting of silicon oxide, silicon nitride, silicon oxynitride, aluminum oxynitride, titanium oxynitride, zirconium oxynitride, hafnium oxynitride, tantalum oxynitride, and tungsten oxynitride. The diffusion prevention pattern DP is the same as a passivation film 600 as will be described later in that both includes the inorganic insulating material, but both may include different inorganic insulating materials.

The ohmic contact layer 800 including an n-type impurity doped at a high concentration may be disposed on the semiconductor pattern layer 700. The ohmic contact layer 800 may overlap the entire semiconductor pattern layer 700 or a part of the semiconductor pattern layer 700.

In the embodiments of the present invention, a part of the semiconductor pattern layer 700 may be exposed through the ohmic contact layer 800. The channel unit ch may be disposed in a space on the semiconductor pattern layer 700 exposed through the ohmic contact layer 800. That is, the channel unit ch may be disposed in the space formed by the spaced ohmic contact layers 800.

The ohmic contact layer 800 may be disposed to perfectly overlap the source electrode SE, the drain electrode DE, and a drain electrode extension unit 150 as will be described later. However, the aforementioned ohmic contact layer is illustrative, and the ohmic contact layer 800 may partially overlap the source electrode SE, the drain electrode DE, and the drain electrode extension unit 150. That is, in another illustrative embodiment, the ohmic contact layer 800 may be perfectly covered by the source electrode SE, the drain electrode DE, and the drain electrode extension unit 150.

At least a part of the diffusion prevention pattern DP may be exposed through the ohmic contact layer 800. In other words, at least a part of the diffusion prevention pattern DP overlapping the channel unit ch may be exposed through the ohmic contact layer 800.

The data wires DL, SE, DE, and 150 (not shown) may be disposed on the ohmic contact layer 800. The data wires DL, SE, DE, and 150 (not shown) may include the data line DL extending in a second direction, for example, an y-axis direction in FIG. 1 to cross the gate line GL, the source electrode SE branched in a branch form from the data line DL to extend to an upper portion of the semiconductor pattern layer 700, the drain electrode DE spaced apart from the source electrode SE and disposed on the semiconductor pattern layer 700 to face the source electrode SE while the gate electrode GE or the channel unit ch is interposed between the source electrode and the drain electrode, and the drain electrode extension unit 150 extending from the drain electrode DE to be electrically connected to a pixel electrode PE as will be described later. The drain electrode extension unit 150 may have a width that is relatively larger than that of the drain electrode DE to more easily bring the drain electrode into electric contact with the pixel electrode PE.

The data wires DL, SE, DE, and 150 (not shown) may have a single or multiple film structure including nickel (Ni), cobalt (Co), titanium (Ti), silver (Ag), copper (Cu), molybdenum (Mo), aluminum (Al), beryllium (Be), niobium (Nb), gold (Au), iron (Fe), selenium (Se), or tantalum (Ta). Further, an alloy including one or more elements selected from the group consisting of titanium (Ti), zirconium (Zr), tungsten (W), tantalum (Ta), niobium (Nb), platinum (Pt), hafnium (Hf), oxygen (O), and nitrogen (N) in addition to the aforementioned metal may be applied. However, the aforementioned material is illustrative, and the material of the data wires DL, SE, DE, and 150 (not shown) is not limited thereto.

FIG. 1 shows one thin film transistor disposed in one pixel, but naturally, the scope of the present invention is not limited thereto. That is, in another illustrative embodiment, a plurality of thin film transistors may be disposed in one pixel.

The channel unit ch may be disposed in the space between the source electrode SE and the drain electrode DE. The space between the source electrode SE and the drain electrode DE may overlap the aforementioned space on the upper surface of the semiconductor pattern layer 700 exposed through the ohmic contact layer 800. Further, the space may overlap the aforementioned diffusion prevention pattern DP. Consequently, the space between the channel unit ch, the source electrode SE, and the drain electrode DE may overlap at least a part of the diffusion prevention pattern DP.

In other words, side walls of the source electrode SE and the drain electrode DE and a side wall of the ohmic contact layer 800 through which the diffusion prevention pattern DP is exposed may be aligned with each other. Accordingly, at least a part of the upper surface of the diffusion prevention pattern DP may be exposed, and the passivation film 600 as will be described later may come into direct contact with the upper surface of the diffusion prevention pattern DP.

The passivation film 600 may be disposed on the data wires DL, SE, DE, and 150 (not shown), the ohmic contact layer 800, and the diffusion prevention pattern DP.

The passivation film 600 may include an inorganic insulating material. For example, the passivation film 600 may include silicon oxide, silicon nitride, silicon oxynitride, aluminum oxynitride, titanium oxynitride, zirconium oxynitride, hafnium oxynitride, tantalum oxynitride, or tungsten oxynitride. However, the aforementioned materials are illustrative, and the material of the passivation film 600 is not limited thereto.

A contact hole may be formed through the passivation film 600 to expose the drain electrode extension unit 150.

The pixel electrode PE may be disposed on the passivation film 600. The pixel electrode PE may be electrically connected to the drain electrode DE through the contact hole formed through the passivation film 600.

In the illustrative embodiment, the pixel electrode PE may include a transparent conductor such as ITO (indium tin oxide) or IZO (indium zinc oxide) or a reflective conductor such as aluminum.

FIG. 1 shows the pixel electrode PE having a flat plate shape, but the shape of the pixel electrode is not limited thereto. That is, in another illustrative embodiment, the pixel electrode may have a structure having one or more slits. Further, in another illustrative embodiment, one or more pixel electrodes may be disposed, and different voltages may be applied to a plurality of pixel electrodes.

Hereinafter, the thickness of the semiconductor pattern layer 700 will be more specifically described with reference to FIG. 3.

Referring to FIG. 3, the height h1 (hereinafter, referred to as "first height") of the semiconductor pattern layer 700 overlapping the channel unit ch and the height h2 (hereinafter, referred to as "second height") of the semiconductor pattern layer 700 not overlapping the channel unit ch may be substantially the same. Typically, when the ohmic contact layer 800 is dry etched to be patterned, a part of the upper surface of the semiconductor pattern layer 700 may be etched together with the ohmic contact layer 800. That is, the height of the center of the semiconductor pattern layer 700 may be relatively smaller than those of both sides. Due to a height difference of the semiconductor pattern layer 700, an electric property of the semiconductor pattern layer 700 may be reduced.

When the diffusion prevention pattern DP is adopted and the ohmic contact layer 800 and the source electrode SE/drain electrode DE are wet etched simultaneously like in the liquid crystal displays according to the embodiments of the present invention, a part of the upper surface of the semiconductor pattern layer 700 may be prevented from being etched. Accordingly, the upper surface of the semiconductor pattern layer 700 may have the uniform height. When the height of the upper surface of the semiconductor pattern layer 700 is uniform, a relatively favorable electric property may be attained as compared to the non-uniform height of the upper surface.

FIG. 4 is a graph showing a change in wet etching rate according to a phosphorus (P) atom content of the ohmic contact layer 800 according to the embodiments of the present invention.

Referring to FIG. 4, the ohmic contact layer 800 according to the embodiments of the present invention may include the phosphorus (P) atom at a predetermined concentration or more.

Typically, the ohmic contact layer 800 is not etched using a wet etching process. However, when the ohmic contact layer 800 includes the phosphorus (P) atom at a predetermined concentration or more, the ohmic contact layer 800 may be etched using the wet etching process. That is, as shown in FIG. 4, when the concentration of the phosphorus (P) atom included in the ohmic contact layer 800 is 1.74E+21/cm3 or more, the ohmic contact layer 800 may be easily patterned through the wet etching process. As described above, when the ohmic contact layer 800 is patterned through wet etching, the source electrode SE/drain electrode DE and the ohmic contact layer 800 may be wet etched simultaneously as will be described later. Accordingly, a dry etching process for patterning the ohmic contact layer 800 may be omitted to improve efficiency of the process. Additionally, the semiconductor pattern layer 700 is not etched using wet etching, and thus, as described above, the semiconductor pattern layer 700 having the upper surface having the uniform height may be attained. However, as described above, when the ohmic contact layer 800 includes the phosphorus (P) atom, a part of the phosphorus (P) atom may be diffused into the semiconductor pattern layer 700. When the phosphorus (P) atom is diffused into the semiconductor pattern layer 700, charge mobility of the semiconductor pattern layer 700 may be reduced.

When the diffusion prevention pattern DP is disposed on the semiconductor pattern layer 700 like in the embodiments of the present invention, the phosphorus (P) atom may be prevented from being diffused into the semiconductor pattern layer 700. That is, the diffusion prevention pattern DP has affinity with the phosphorus (P) atom that is higher than that of the semiconductor pattern layer 700, and thus the phosphorus (P) atom may be diffused into the diffusion prevention pattern DP instead of the semiconductor pattern layer 700.

Hereinafter, a liquid crystal display according to another embodiment of the present invention will be described. In the following embodiment, like reference numerals designate like elements having the same configuration as the matter described in advance, and the overlapping description will be omitted or simplified.

Figure 5:
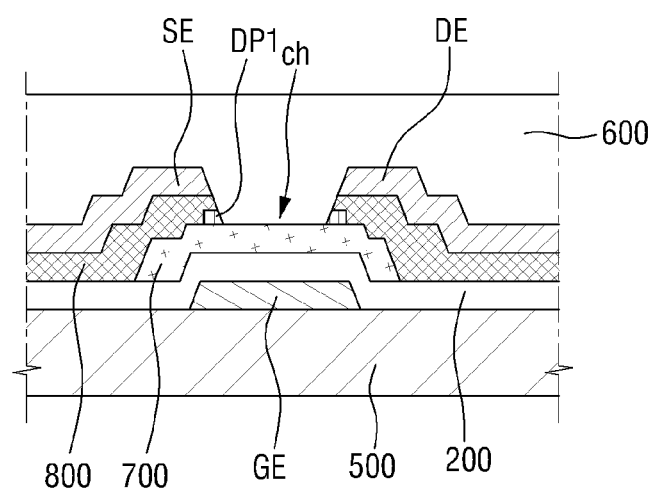
FIG. 5 is a cross-sectional view of a liquid crystal display device according to another embodiment of the present invention.

FIG. 5 is a cross-sectional view of the liquid crystal display according to another embodiment of the present invention.

Referring to FIG. 5, the liquid crystal display according to another embodiment of the present invention is different from that of the embodiment of FIG. 3 in that the semiconductor pattern layer 700 is exposed through a diffusion prevention pattern DP1.

A part of the upper surface of the semiconductor pattern layer 700 overlapping the gate electrode GE may be exposed through the diffusion prevention pattern DP1. The aforementioned constitution may be caused by a method of manufacturing the liquid crystal display according to the embodiments of the present invention as will be described later in conjunction with FIG. 13, but the embodiment is not limited thereto.

An inner wall of the diffusion prevention pattern DP1 may be disposed to be aligned with an inner wall of the ohmic contact layer 800 and inner walls of the source electrode SE/drain electrode DE. That is, at least a part of the inner wall of the diffusion prevention pattern DP1 may be exposed through the ohmic contact layer 800. In other words, the passivation film 600 filling the channel unit ch may come into direct contact with the inner wall of the diffusion prevention pattern DP1.

Figure 6:
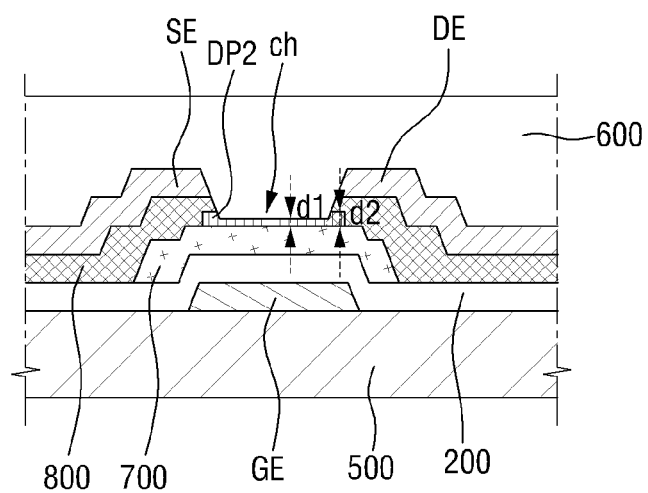
FIG. 6 is a cross-sectional view of a liquid crystal display device according to another embodiment of the present invention.

FIG. 6 is a cross-sectional view of the liquid crystal display according to another embodiment of the present invention.

Referring to FIG. 6, a diffusion prevention pattern DP2 of the liquid crystal display according to another embodiment of the present invention is different from that of the embodiment of FIG. 3 in that the height d1 of the center is smaller than those of both ends i.e. d2.

The height of the diffusion prevention pattern DP2 may be non-uniform. The aforementioned constitution may be caused by the method of manufacturing the liquid crystal display as will be described later in conjunction with FIG. 14, but the embodiment is not limited thereto. Specifically, in the diffusion prevention pattern DP2, portions overlapping and not overlapping the ohmic contact layer 800 may have different heights. The different heights may result from the ohmic contact layer 800 acting as an etching blocking film during an etching process, but the embodiment is not limited thereto.

Hereinafter, a method of manufacturing a liquid crystal display device according to an embodiment of the present invention will be described. Some of the configurations described below may be the same as those of the above-mentioned liquid crystal display according to some embodiments of the invention. In order to avoid duplicate description, a description of some configurations will be omitted.

FIGS. 7 to 12 are cross-sectional views illustrating a method of manufacturing a liquid crystal display device according to an embodiment of the present invention.

Referring to FIGS. 7 to 12, a method of manufacturing a liquid crystal display device according to an embodiment of the present invention includes the steps of providing a first substrate 500 including a gate electrode GE and a gate insulating film 200 disposed on the gate electrode GE; forming a semiconductor layer 750 on the gate insulating film 200 and forming a diffusion prevention layer 950 on the semiconductor layer 750; patterning the diffusion prevention layer 950 to form a diffusion prevention pattern DP and patterning the semiconductor layer 750 to form a semiconductor pattern layer 700; forming an ohmic contact layer 800 and a first conductive film 450 on the diffusion prevention pattern DP and the semiconductor pattern layer 700; and batch-etching the first conductive film 450 and the ohmic contact layer 800 to form a channel unit.

Figure 7:
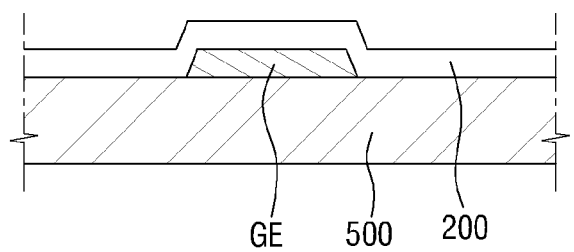
FIG. 7 is a cross-sectional view illustrating a method of manufacturing a liquid crystal display device according to an embodiment of the present invention.

First, referring to FIG. 7, a gate electrode GE is formed on a first substrate 500. The gate electrode GE may be formed by patterning a conductor for gate wires. The conductor for gate wires may be formed by one or more methods selected from the group consisting of chemical vapor deposition, plasma enhanced chemical vapor deposition, physical vapor deposition, and sputtering.

Subsequently, a gate insulating film 200 is formed on the gate electrode GE. The gate insulating film 200 may be formed by chemical vapor deposition or the like.

Figure 8:
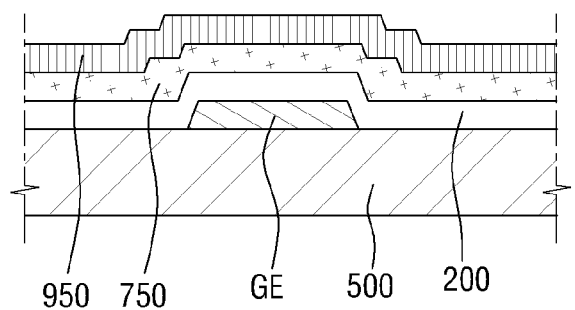
FIG. 8 is a cross-sectional view illustrating a method of manufacturing a liquid crystal display device according to an embodiment of the present invention.

Subsequently, referring to FIG. 8, a semiconductor layer 750 and a diffusion prevention layer 950 are formed on the gate insulating film 200. The semiconductor layer 750 may contain amorphous silicon. The semiconductor layer 750 may be formed by chemical vapor deposition or the like, but the method of forming the semiconductor layer 750 is not limited thereto.

The diffusion prevention layer 950 may be formed on the semiconductor layer 750. The diffusion prevention layer 950 may contain an inorganic insulating material. For example, the diffusion prevention layer 950 may contain one or more selected from the group consisting of silicon oxide, silicon nitride, silicon oxynitride, aluminum oxynitride, titanium oxynitride, zirconium oxynitride, hafnium oxynitride, tantalum oxynitride, and tungsten oxynitride.

Figure 9:
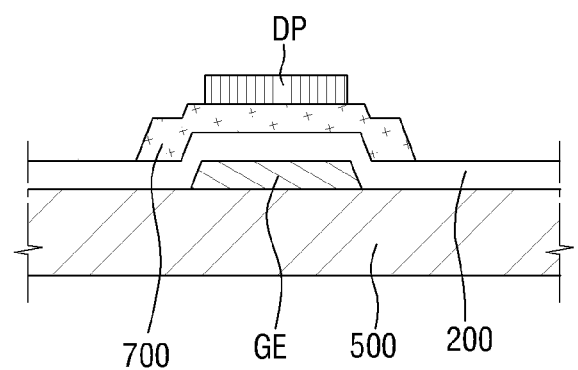
FIG. 9 is a cross-sectional view illustrating a method of manufacturing a liquid crystal display device according to an embodiment of the present invention.

Subsequently, referring to FIG. 9, the step of patterning the diffusion prevention layer 950 to form a diffusion prevention pattern DP and patterning the semiconductor layer 750 to form a semiconductor pattern layer 700 is performed. The diffusion prevention layer 950 may be etched by a photoresist pattern or a mask. The diffusion prevention layer 950 is etched to form the diffusion prevention pattern DP. The diffusion prevention pattern DP may be substantially identical to those that have been described in the liquid crystal display devices according to some embodiments of the present invention. Therefore, a detailed description thereof will be omitted.

Subsequently, the semiconductor layer 750 may be patterned. The patterning of the semiconductor layer 750 may be performed by wet etching. The semiconductor pattern layer 700 may be formed by patterning the semiconductor layer 750. The semiconductor pattern layer 700 may overlap the above diffusion prevention pattern DP. However, the width of the semiconductor pattern layer 700 may be greater than the width of the diffusion prevention pattern DP.

Figure 10:
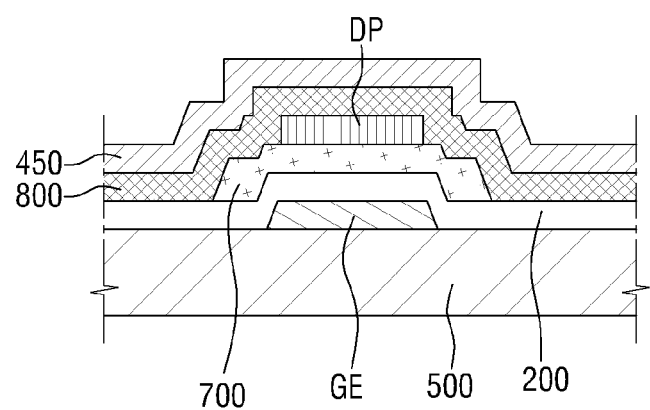
FIG. 10 is a cross-sectional view illustrating a method of manufacturing a liquid crystal display device according to an embodiment of the present invention.

Subsequently, referring to FIG. 10, the step of sequentially forming an ohmic contact layer 800 and a first conductive film 450 on the semiconductor pattern layer 700, the diffusion prevention pattern DP, and the gate insulating film 200 is performed.

The ohmic contact layer 800 may be substantially identical to those that have been described in the liquid crystal display devices according to some embodiments of the present invention. Therefore, a detailed description thereof will be omitted.

The first conductive film 450 may have a single or multiple film structure including nickel (Ni), cobalt (Co), titanium (Ti), silver (Ag), copper (Cu), molybdenum (Mo), aluminum (Al), beryllium (Be), niobium (Nb), gold (Au), iron (Fe), selenium (Se), or tantalum (Ta). Further, an alloy including one or more elements selected from the group consisting of titanium (Ti), zirconium (Zr), tungsten (W), tantalum (Ta), niobium (Nb), platinum (Pt), hafnium (Hf), oxygen (O), and nitrogen (N) in addition to the aforementioned metal may be applied. That is, the first conductive film 450 may be patterned to form the data wires DL, SE, DE, and 150 (not shown) that have been described in the liquid crystal display devices according to some embodiments of the present invention.

Subsequently, referring to FIG. 11, the step of batch-etching the first conductive film 450 and the ohmic contact layer 800 is performed. The first conductive film 450 and the ohmic contact layer 800 may be wet-etched. When the ohmic contact layer 800 includes the phosphorus (P) atom at a predetermined concentration or more, the ohmic contact layer 800 may be wet-etched as described with reference to FIG. 4.

The first conductive film 450 and the ohmic contact layer 800 may be wet-etched by the same etchant. Thus, a channel unit ch may be formed. Due to the formation of the channel unit ch, at least a part of the upper surface of the diffusion prevention pattern DP overlapping the channel unit ch may be exposed. That is, the first conductive film 450 and the ohmic contact layer 800 are batch-etched, thereby forming a source electrode SE, a drain electrode DE, and the channel unit ch disposed between the source electrode SE and the drain electrode DE. Further, with the formation of the channel unit ch, at least a part of the upper surface of the diffusion prevention pattern DP overlapping the channel unit ch may be exposed. That is, while batch-etching the first conductive film 450 and the ohmic contact layer 800, the diffusion prevention pattern DP may be at least partially etched. As shown in FIG. 11, a part of the diffusion prevention pattern DP remains, and the remaining diffusion prevention pattern DP may be disposed on the semiconductor pattern layer 700.

Figure 12:
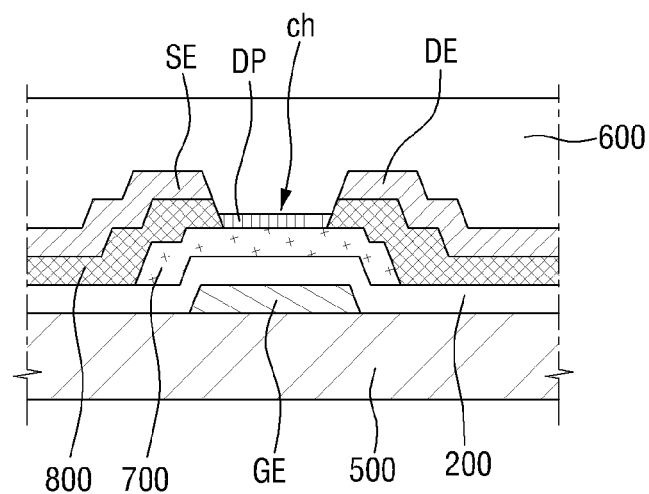
FIG. 12 is a cross-sectional view illustrating a method of manufacturing a liquid crystal display device according to an embodiment of the present invention.

Subsequently, referring to FIG. 12, a passivation film 600 is formed on the source electrode SE, the drain electrode DE, the ohmic contact layer 800, and the diffusion prevention pattern DP. The passivation film 600 may be substantially identical to those that have been described in the liquid crystal display devices according to some embodiments of the present invention. Therefore, a detailed description thereof will be omitted.

Hereinafter, a method of manufacturing a liquid crystal display device according to another embodiment of the present invention will be described. In the following embodiment, like reference numerals designate like elements having the same configuration as the matter described in advance, and the overlapping description will be omitted or simplified.

Figure 13:
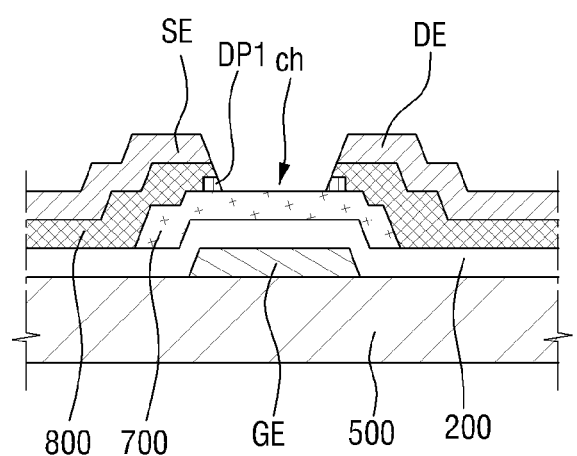
FIG. 13 is a cross-sectional view illustrating a method of manufacturing a liquid crystal display device according to another embodiment of the present invention.

FIG. 13 is a cross-sectional view illustrating a method of manufacturing a liquid crystal display device according to another embodiment of the present invention and is analogous to the arrangement of FIG. 5.

Figure 11:
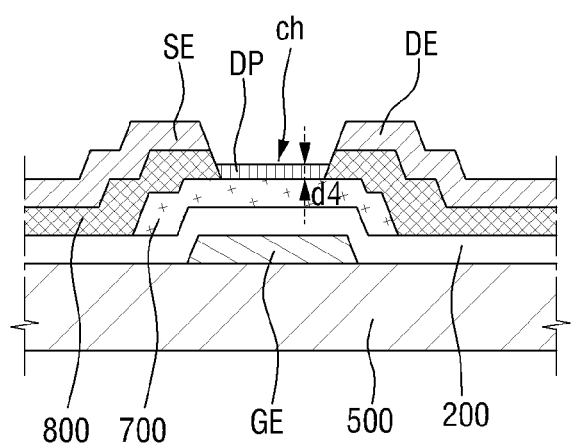
FIG. 11 is a cross-sectional view illustrating a method of manufacturing a liquid crystal display device according to an embodiment of the present invention.

Referring to FIG. 13, this embodiment is different from the embodiment of FIG. 11 in that, with the batch-etching of the first conductive film 450 and the ohmic contact layer 800, the diffusion prevention pattern DP is simultaneously etched, so as to expose the upper surface of the semiconductor pattern layer 700.

When the first conductive film 450 and the ohmic contact layer 800 may be wet-etched using the same etchant, the diffusion prevention pattern DP may be at least partially etched. Illustratively, the diffusion prevention pattern DP exposed by the source electrode SE, the drain electrode DE, and the ohmic contact layer 800 is etched, so as to expose the semiconductor pattern layer 700. However, even in this case, the diffusion prevention pattern DP overlapping the residual portion excluding the etched portion of the ohmic contact layer 800 may remain without being etched. The resulting product obtained in this way may be substantially identical to the liquid crystal display device that has been described with reference to FIG. 5. Therefore, a detailed description thereof will be omitted.

Figure 14:
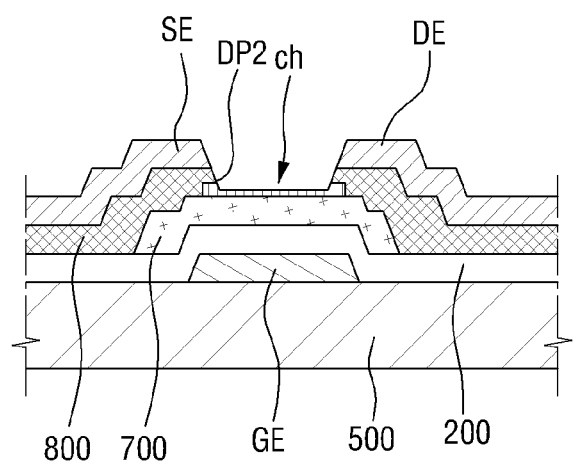
FIG. 14 is a cross-sectional view illustrating a method of manufacturing a liquid crystal display device according to still another embodiment of the present invention.

FIG. 14 is a cross-sectional view illustrating a method of manufacturing a liquid crystal display device according to still another embodiment of the present invention and is analogous to the arrangement of FIG. 6.

Referring to FIG. 14, this embodiment is different from the embodiment of FIG. 11 in that, with the batch-etching of the first conductive film 450 and the ohmic contact layer 800, the diffusion prevention pattern DP is simultaneously etched, and thus the thickness of the center of the diffusion prevention pattern DP is different from the thickness of both ends thereof.

The center of the diffusion prevention pattern DP may be partially etched. However, even in this case, a part thereof overlapping the ohmic contact layer 800 not to be etched may not be etched. Therefore, the height of the center of the diffusion prevention pattern DP may be lower than the height of both ends thereof.

Figure 15:
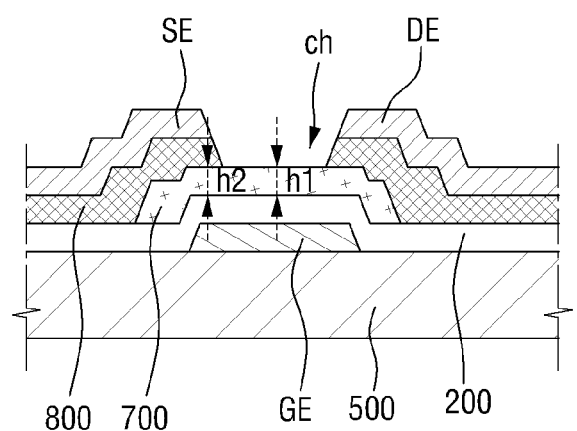
FIG. 15 is a cross-sectional view illustrating a method of manufacturing a liquid crystal display device according to still another embodiment of the present invention.

FIG. 15 is a cross-sectional view illustrating a method of manufacturing a liquid crystal display device according to still another embodiment of the present invention.

Referring to FIG. 15, this embodiment is different from the embodiment of FIG. 11 in that, with the batch-etching of the first conductive film 450 and the ohmic contact layer 800, the diffusion prevention pattern DP is entirely etched.

In exemplary embodiment, since the diffusion prevention pattern DP is entirely etched, the diffusion prevention pattern DP may not remain in the resulting product after the the batch-etching of the first conductive film 450 and the ohmic contact layer 800. However, even in this case, it is possible to prevent the phosphorus (P) contained in the ohmic contact layer 800 from diffusing into the semiconductor pattern layer 700, while the diffusion prevention pattern DP is disposed on the substrate.

Further, since the semiconductor pattern layer 700 is not etched by wet etching even when the diffusion prevention pattern DP is entirely etched, the height h1 of the center of the semiconductor pattern layer 700 may be substantially equal to the height h2 of the side end thereof. Therefore, the deterioration in electrical characteristics of the semiconductor pattern layer 700 due to the ununiformity in height of the the semiconductor pattern layer 700 can be prevented.

As described above, according to embodiments of the present invention, there are the following effects.

That is, it is possible to realize a liquid crystal display including a semiconductor pattern layer having excellent electrical characteristics.

Further, it is possible to provide a method of manufacturing a liquid crystal display device, by which the production efficiency of a liquid crystal display device is improved by omitting some processes.

The effects of the present invention are not limited by the foregoing, and other various effects are anticipated herein.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

While the present invention has been particularly illustrated and described with reference to exemplary embodiments thereof, it will be understood by those of ordinary skill in the art that various changes in form and detail may be made therein without departing from the spirit and scope of the present invention as defined by the following claims.

The exemplary embodiments should be considered in a descriptive sense only and not for purposes of limitation.

What is claimed is:

1. A liquid crystal display device, comprising:
a first substrate;
a gate electrode disposed on the first substrate;
a semiconductor pattern layer disposed on the gate electrode;
a diffusion prevention pattern disposed on the semiconductor pattern layer;
an ohmic contact layer disposed on the semiconductor pattern layer and exposing a part of the diffusion prevention pattern, the ohmic contact layer comprises phosphorous (P) atoms at a concentration of at least $1.74 \times 10^{21}/cm^3$; and
a source electrode and a drain electrode disposed on the ohmic contact layer to overlap the ohmic contact layer and facing each other to be spaced apart from each other.

2. The liquid crystal display device of claim 1,
wherein a channel unit is disposed in the space between the source electrode and the drain electrode spaced apart from each other, and
the diffusion prevention pattern overlaps the channel unit.

3. The liquid crystal display device of claim 1, wherein the outer end of the diffusion prevention pattern is relatively inwardly disposed compared to the outer end of the semiconductor pattern layer.

4. The liquid crystal display device of claim 1, wherein the diffusion prevention pattern exposes the upper surface of the semiconductor pattern layer overlapping the gate electrode.

5. The liquid crystal display device of claim 1, wherein the height of the center of the diffusion prevention pattern is different from the height of both ends of the diffusion prevention pattern.

6. The liquid crystal display device of claim 1, wherein the inner wall of the diffusion prevention pattern, the source electrode, the drain electrode, and the inner wall of the ohmic contact layer are aligned each other.

7. The liquid crystal display device of claim 1, further comprising:
a passivation film disposed on the source electrode and the drain electrode,
wherein the diffusion prevention pattern is made of a first inorganic insulating material, and the passivation film is made of a second inorganic insulating material different from the first insulating material.

8. A method of manufacturing a liquid crystal display device, comprising:
providing a first substrate including a gate electrode and a gate insulating film disposed on the gate electrode;
forming a semiconductor layer on the gate insulating film and forming a diffusion prevention layer on the semiconductor layer;
forming a diffusion prevention pattern by patterning the diffusion prevention layer and forming a semiconductor pattern layer by patterning the semiconductor layer;
forming an ohmic contact layer and a first conductive film on the diffusion prevention pattern and the semiconductor pattern layer; and
forming a channel unit by batch-etching the first conductive film and the ohmic contact layer.

9. The method of claim 8,
wherein forming the channel unit by the batch-etching the first conductive film and the ohmic contact layer includes:
batch-etching the first conductive film and the ohmic contact layer to expose the upper surface of the diffusion prevention pattern.

10. The method of claim 8,
wherein the batch-etching the first conductive film and the ohmic contact layer to form the channel unit includes:
exposing the upper surface of the semiconductor pattern layer by etching the diffusion prevention pattern.

11. The method of claim 8, wherein forming the channel unit by batch-etching the first conductive film and the ohmic contact layer includes:
etching a part of the center of the diffusion prevention pattern such that
obtaining a difference between the height of the center of the diffusion prevention pattern and the height of both sides of the diffusion prevention pattern.

12. The method of claim 8, wherein the batch-etching the first conductive film and the ohmic contact layer to form the channel unit includes:
completely removing the diffusion prevention pattern.

13. The method of claim 8, wherein the ohmic contact layer contains a phosphorus (P) atom.

14. The method of claim 13, wherein the concentration of the phosphorus (P) atom is 1.74E+21/cm3 or more.

15. The method of claim 8, wherein the diffusion prevention layer is simultaneously etched with the ohmic contact layer.

16. The method of claim 8, wherein the batch-etching is carried out using wet etching process.

17. The liquid crystal display device of claim 1, wherein the semiconductor pattern layer overlapped by the diffusion prevention pattern has a uniform thickness.

18. The liquid crystal display device of claim 1, wherein the diffusion prevention pattern has a higher affinity for the phosphorous atoms than the semiconductor pattern layer, the diffusion prevention pattern to prevent the phosphorous atoms of the ohmic contact layer from diffusing into the semiconductor pattern layer.

19. The liquid crystal display device of claim 1 being produced by a process comprising depositing the ohmic contact layer onto the previously formed semiconductor pattern and the previously formed diffusion prevention pattern.

20. A liquid crystal display device, comprising:
a first substrate;
a gate electrode disposed on the first substrate;
a semiconductor pattern layer disposed on the gate electrode;
a diffusion prevention pattern disposed on the semiconductor pattern layer;
an ohmic contact layer disposed on the semiconductor pattern layer and exposing a part of the diffusion prevention pattern; and
a source electrode and a drain electrode disposed on the ohmic contact layer to overlap the ohmic contact layer and facing each other to be spaced apart from each other, wherein a channel unit is disposed in the space between the source electrode and the drain electrode spaced apart from each other, and the diffusion prevention pattern overlaps the channel unit.

21. The liquid crystal display device of claim 20, wherein the ohmic contact layer is absent from and does not overlap the channel unit.

* * * * *